US005432378A

United States Patent [19]

Whitney et al.

[11] Patent Number: 5,432,378

[45] Date of Patent: Jul. 11, 1995

[54] SUBMINIATURE SURFACE MOUNTED CIRCUIT PROTECTOR

[75] Inventors: Stephen Whitney, Manchester; Varinda Kalra, Chesterfield; Vernon Spaunhorst, Washington; Leon Gurevich, Grover; Joan Winnett, St. Louis, all of Mo.

[73] Assignee: Cooper Industries, Inc., Houston, Tex.

[21] Appl. No.: 166,882

[22] Filed: Dec. 15, 1993

[51] Int. Cl.[6] .............................................. H01L 27/02

[52] U.S. Cl. ...................................... 257/529; 337/297

[58] Field of Search ................ 257/329; 337/227, 228, 337/297

[56] References Cited

U.S. PATENT DOCUMENTS 4,011,366 3/1977 Bones et al. .......................... 429/61
4,393,808 7/1983 Braden .
4,395,184 7/1983 Braden .
4,669,416 6/1987 Delgado et al. .
4,873,506 10/1989 Gurevich .
5,095,297 3/1994 Perreault et al. .................. 337/297
5,097,246 3/1992 Cook et al. .
5,166,656 11/1992 Badihi et al. .
5,296,833 3/1994 Breen et al. ......................... 337/297

*Primary Examiner*—J. Carroll
*Attorney, Agent, or Firm*—Burns, Doane, Swecker & Mathis

[57] ABSTRACT

A subminiature circuit protector includes an electrically insulating substrate, a fuse element connecting end termination pads, the termination pads extending to end and lateral edges of the substrate, an electrically insulation cover over the fuse element and termination pads, and end terminations formed over the end and a portion of the lateral surfaces of the substrate electrically connecting with the termination pads.

15 Claims, 3 Drawing Sheets

SUBMINIATURE SURFACE MOUNTED CIRCUIT PROTECTOR

FIELD OF THE INVENTION

The present invention relates to a circuit protector. More particularly, the present invention relates to a subminiature surface mounted circuit protector.

BACKGROUND AND SUMMARY OF THE INVENTION

Subminiature circuit protectors are useful in applications in which size and space limitations are important, for example, on circuit boards for electronic equipment, for denser packing and miniaturization of electronic circuits. Ceramic chip type fuses are known, but current structures are limited in size reduction by the structure of the fusing elements and encapsulation and sealing.

A problem in miniaturizing circuit protectors is that the small size of the fuse element and of the circuit protector itself results in a small contact area between the fuse element and the electrical terminations. The small contact area results in unnecessarily high resistance at the contact, and reduces the reliability and operation of the unit.

The present invention, generally, provides a subminiature surface mountable circuit protector that is simple and relatively inexpensive to manufacture. The present invention also provides a subminiature board mountable circuit protector that has improved reliability and operation.

The subminiature circuit protector of the present invention can be easily manufactured for a variety of voltage and current ratings.

The circuit protector according to the invention includes a substrate of electrically insulating material, such as ceramic or glass. The substrate has a flat top surface, opposing end edges and opposing lateral edges. Termination pads of electrically conductive material are deposited on the top surface at each end, and extend to the end edge and along a portion of the lateral edges. A fuse element of predetermined fusible response positioned across a space between the termination pads connects the termination pads to form a conductive path from end to end of the substrate. A cover of electrically insulating material suffuses over the termination pads and the fuse element to contact and envelop all of the underlying elements.

According to the invention, end terminations are formed by a coating of at least one layer of electrically conductive material that contacts the termination pads along the end edge and lateral edges of the substrate. The end terminations provide a greater contact area than previously known in the art for improving the electrical connection of the terminations to the fuse. In a preferred embodiment, the end coating comprises an inner layer of a silver alloy, a middle layer of nickel, and an outer layer of a tin/lead alloy. The end coating also extends along the lateral edges of the substrate as far as permitted by industry standards.

According to the invention, a cover may comprise glass or ceramic deposited on the top of the circuit protector over the previously deposited components or a polymer material applied to the top and cured by suitable means. Alternatively, the cover may comprise a plate of electrically insulating material, such as glass or ceramic, that is bonded to the top surface by suitable means, such as glass frit or adhesive. The cover may also comprise an uncured ceramic plate mechanically pressed on the top surface and cured to harden and bond it to the substrate.

The fuse element may be a deposited or printed film of gold or silver or another conductive material. Alternatively, the fuse element may comprise a conductive wire. Electrically conductive element pads may be provided to connect the fuse element with the termination pads and improve the electrical connection therethrough.

According to another aspect of the invention, a layer of thermally insulating material may be deposited on the top surface of the substrate below the termination pads and fuse element to improve the function of the fuse element by limiting heat transfer from the fuse element to the substrate.

BRIEF DESCRIPTION OF THE DRAWING FIGURES

Preferred embodiments of the present invention are illustrated in the appended drawings, wherein like elements are provided with the same reference numerals. In the drawings.

DETAILED DESCRIPTION OF PREFERRED EMBODIMENTS

Figure 1:
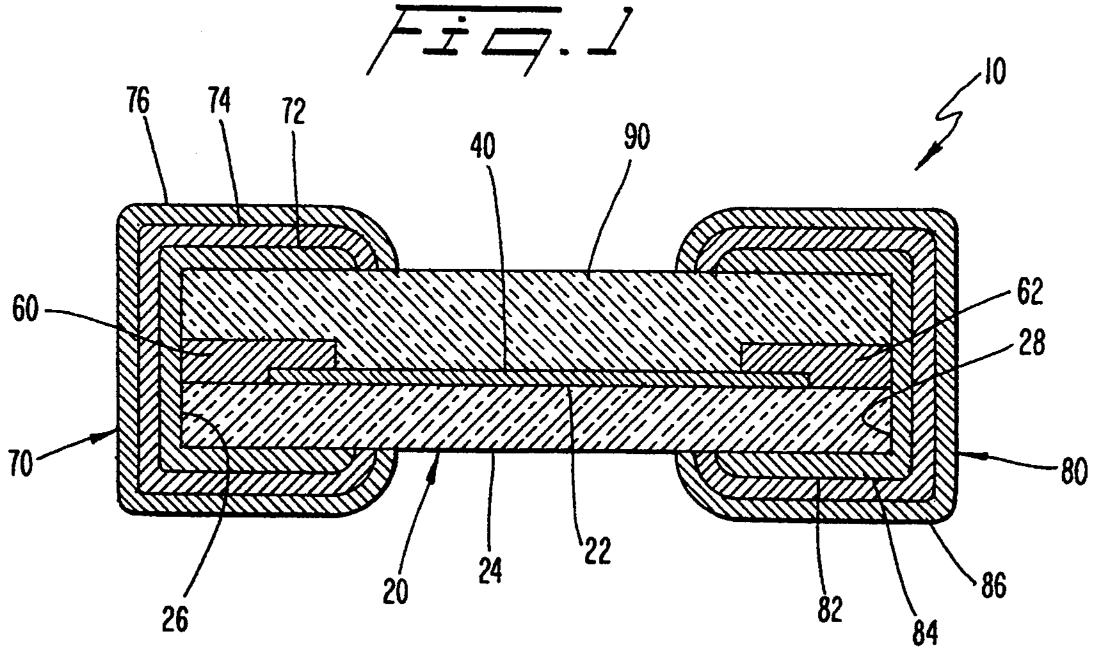
FIG. 1 is a side cross-sectional view of a circuit protector in accordance with the present invention.
Figure 2:
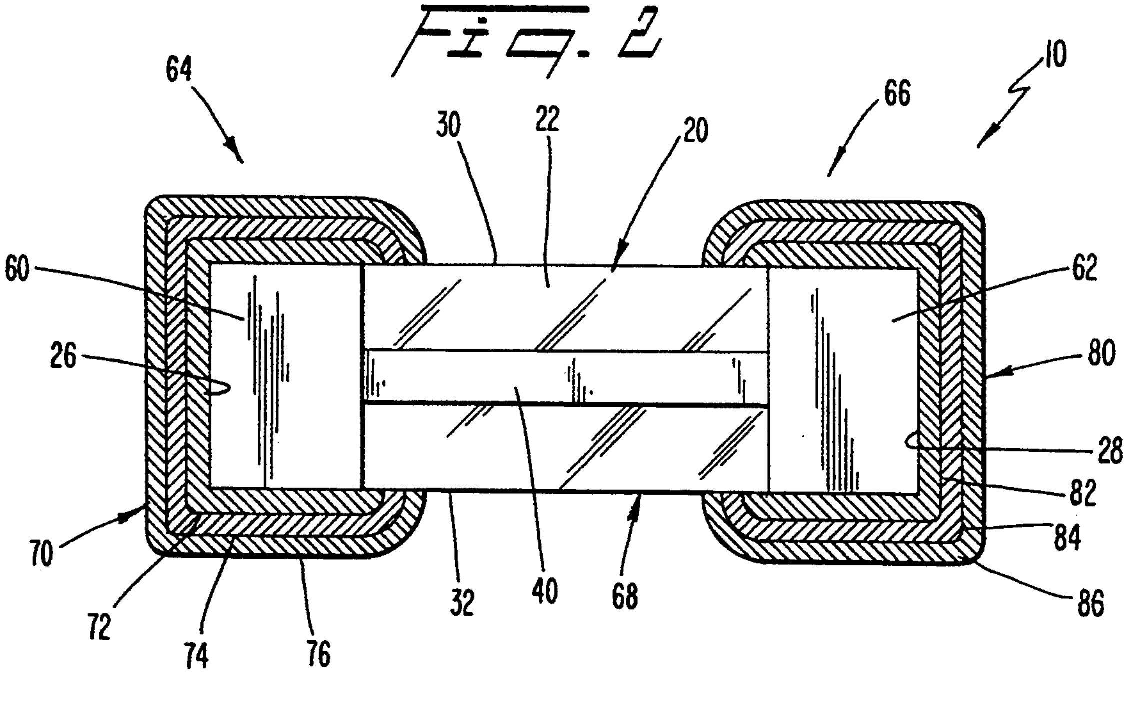
FIG. 2 is a top view of the circuit protector of FIG. 1 with a cover element removed.

Referring first to FIG. 1 and FIG. 2, a circuit protector 10 in accordance with this invention is shown. It is understood that the figures are not to scale, and that the thickness of the various components has been exaggerated for the purposes of clarity of illustration. Further, the invention is not limited to the particular illustrated configurations; the drawing figures illustrate combinations of aspects of the invention that may be selectively incorporated in a circuit protector according to the invention.

The circuit protector 10 comprises a substrate 20 of electrically insulating material, a fuse element 40 deposited on the substrate, and electrical termination pads 60, 62 on the substrate electrically connecting the fuse element to opposing end portion edges of the substrate. End terminations 70, 80 covering the end portions electrically connect with the termination pads 60, 62 to form external electrical terminals for connecting the circuit protector 10 in a circuit.

As an illustrative, but not limiting, example of its size, the circuit protector 10 of the present invention may be made in the range of about 0.050 to 0.400 inches long, 0.020 to 0.300 inches wide, and about 0.020 to 0.250 inches thick.

The substrate 20 is formed of a material such as ceramic or glass in a substantially rectangular shape. The substrate 20 has a planar top surface 22, a bottom surface 24, opposing end edges 26, 28, and opposing lateral edges 30, 32. The fuse element 40 is a film made of an electrically conductive material such as gold, silver or another suitable material, and is deposited on the top surface by suitable means. The fuse element 40 is shaped with a predetermined cross sectional area to provide a desired fuse response, as is known in the art. For example, the fuse element 40 may be formed in the range of 0.0002 to 0.015 inches wide, 0.010 to 0.400 inches long, and 2KÅ to 0.003 inches thick. It may be necessary to deposit the fuse element material in more than one step to obtain a desired thickness, or the etch the deposited material to obtain a desired width, as needed for the particular electrical application.

Figure 3:
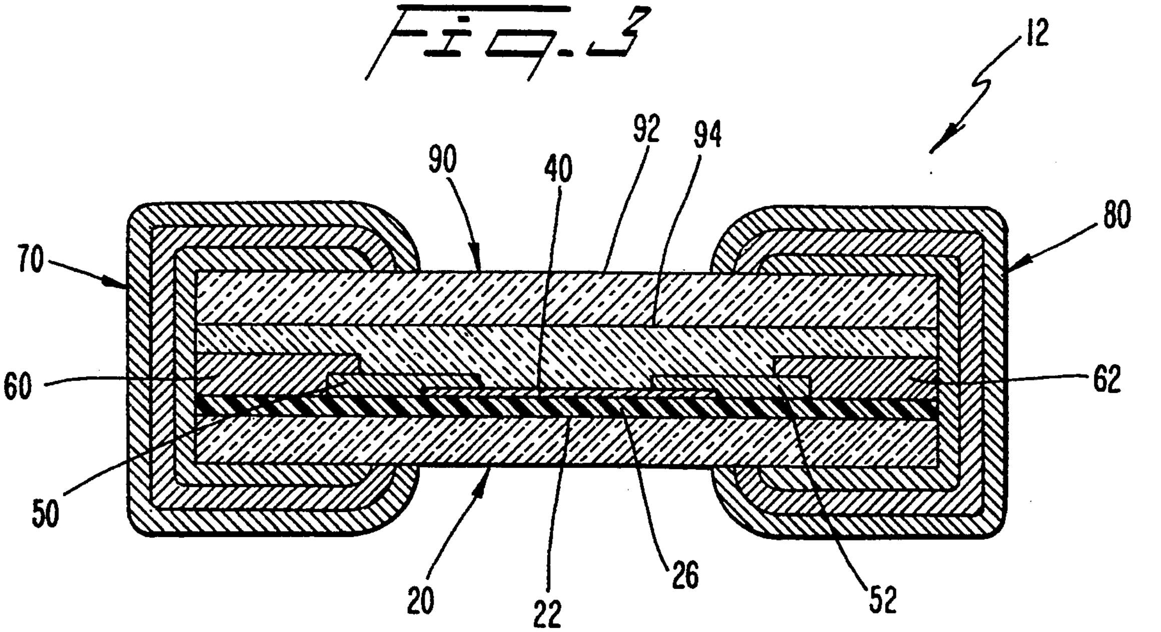
FIG. 3 is a side cross-sectional view of a circuit protector illustrating additional aspects of the invention that may be incorporated in the circuit protector of FIG. 1.

As illustrated in FIG. 3, a layer 90 of thermally insulating material, such as glass or another suitable insulating material, may be applied on the top surface 22 of the substrate. The insulating layer 90 is interposed between at least the fuse 40 and the top surface 22 of the substrate, and as shown, may also reside between the top surface and the other electrical components as well. The thermally insulating layer 26 helps to prevent heat transfer from the fuse element 40 to the substrate 20, which, if made of ceramic, tends to be a relatively good heat conductor. By retaining heat in the fuse element 40, the operational characteristics and reliability of the fuse element are improved.

Referring again to FIG. 1 and FIG. 2, the termination pads 60 and 62 are positioned on opposing end portions 64, 66 of the top surface 22, so that a middle portion 68 of the top surface between the termination pads carries only the fuse element 40. The termination pads 60, 62 are formed of electrically conductive material and, as best seen in FIG. 2, may be deposited on the substrate as is known in the art. The termination pads 60, 62 extend to the end edges 26, 28, and to both of the lateral edges 30, 32 of the top surface 22. The termination pads 60, 62 are deposited over the fuse element 40 to form electrical connections at opposing ends of the fuse element. The termination pads 60, 62 are formed with a predetermined thickness that is at least as thick as the fuse element 40. Referring to FIG. 2, the thickness of the termination pads 60, 62 shown is greater than the thickness of the fuse element 40. This provides good electrical conductivity from the fuse element 40 through the termination pads 60, 62. In addition, the thickness of the termination pads 60, 62 is sufficient to provide a good contact area on the end edges 26, 28 and the lateral edges 30, 32 of the substrate 20 for connecting with the end terminations 70, 80. As an illustrative example, the termination pads 60, 62 may be in the range of 0.0002 to 0.002 inches thick.

Figure 4:
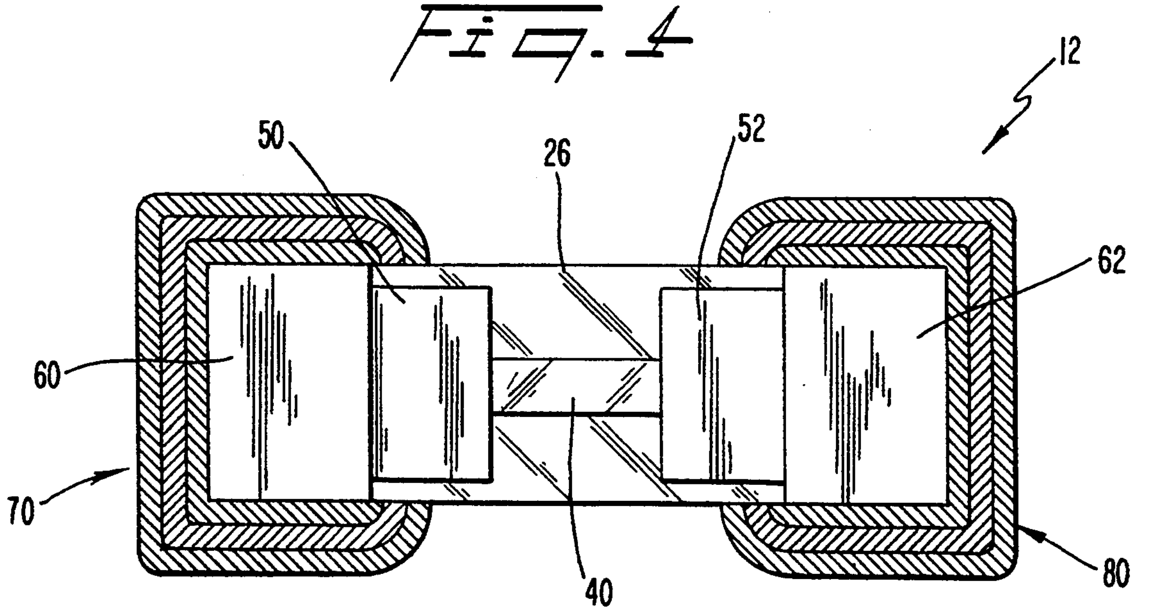
FIG. 4 is a top view of the circuit protector of FIG. 3 with cover elements removed.

As illustrated in FIG. 3 and FIG. 4, contact pads 50, 52 of electrically conductive material may be positioned on the top surface 22 over a portion of the fuse element 40 and under a portion of the termination pads 60, 62. The contact pads 50, 52 are formed of an electrically conductive material and form an electrical connection with the fuse element 40 and the termination pads 60, 62. The contact pads 50, 52 have a thickness at least that of the fuse element 40 and, preferably greater than the thickness of the fuse element 40. For example, the thickness of the contact pads may be in the range of 0.0001 to 0.001 inches thick. The electrical connection between the fuse element 40 and the termination pads 60, 62 is improved by the interposed contact pads 50, 52, which act as a bridge between the fuse element and the termination pads and provide an increased area of contact with the fuse element.

A cover 90 of electrically insulating material is placed directly on the termination pads 60, 62 and the fuse element 40 on the top surface 22. The cover may be formed of glass or ceramic or another suitable material. The cover suffuses the top surface 22 and deposited components, that is, contacts all exposed surfaces and of the termination pads 60, 62, the fuse element 40, and the top surface 22, and fills any voids around and between them.

In the embodiment illustrated in FIG. 1, the cover 90 is printed glass or a high temperature stable polymer material applied directly on the top surface 22. Alternatively, the cover may comprise a layer of green ceramic material that is mechanically pressed over the top surface 22 to suffuse the underlying components, and the assembly then fired to cure the ceramic cover.

As illustrated in FIG. 3, the cover may also alternatively comprise a plate 92 of electrically insulating material that is bonded by a layer of bonding material 94 to the top surface 22 over the assembled components. The bonding material 94 is applied to the top surface 22 to suffuse the top surface and the assembled components as described above, and the cover placed on the bonding material. The bonded cover may comprise a glass plate bonded by a glass frit layer. Alternatively, the bonded cover may comprise a plate of cured ceramic bonded by a ceramic adhesive.

The end terminations 70, 80 comprise electrically conductive material coated over the end portions 64, 66 of the circuit protector subassembly after the cover has been put in place. The end terminations 70, 80 may be coated on the circuit protector subassembly as is known in the art, for example, by dipping an end portion of the subassembly in a suitable coating bath followed by firing. The end terminations 70, 80 contact the termination pads 60, 62 at the end edges 26, 28 and on the lateral edges 30, 32. The end terminations 70, 80 extend along the lateral edges 30, 32 of the substrate as far allowed by industry standards, and so that the lateral edges of the termination pads 60, 62 are at least partially enclosed in the end terminations. The end terminations 70, 80 also correspondingly extend over a portion of the cover 90 and the bottom surface 24 of the substrate.

According to a preferred embodiment of the invention, as illustrated in FIGS. 1 and 2, the end terminations 70, 80 comprise an inner layer 72, 82 of an electrically conductive material, such as silver, a silver alloy or a silver containing composition such as palladium-silver. A middle barrier layer coating 74, 84 of a material such as nickel is applied over the inner layer, and an outer layer 76, 86 of a solderable material, such as a lead/tin composition is applied over the middle layer. The outer layers 76, 86 facilitate attachment by soldering of the circuit protector in an electrical circuit.

Figure 5:
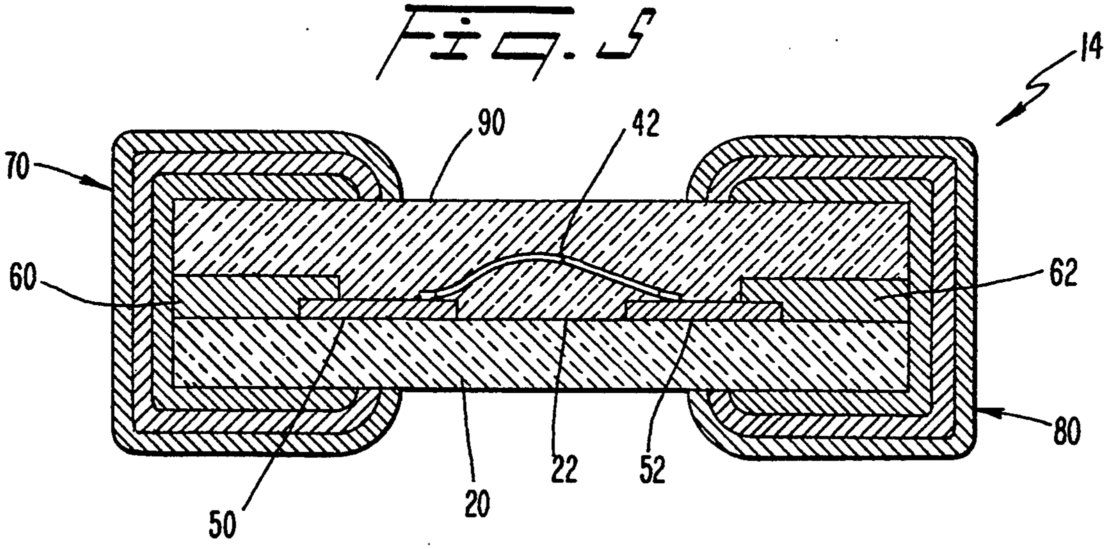
FIG. 5 is a side cross-sectional view of a circuit protector according to an alternative embodiment of the invention.
Figure 6:
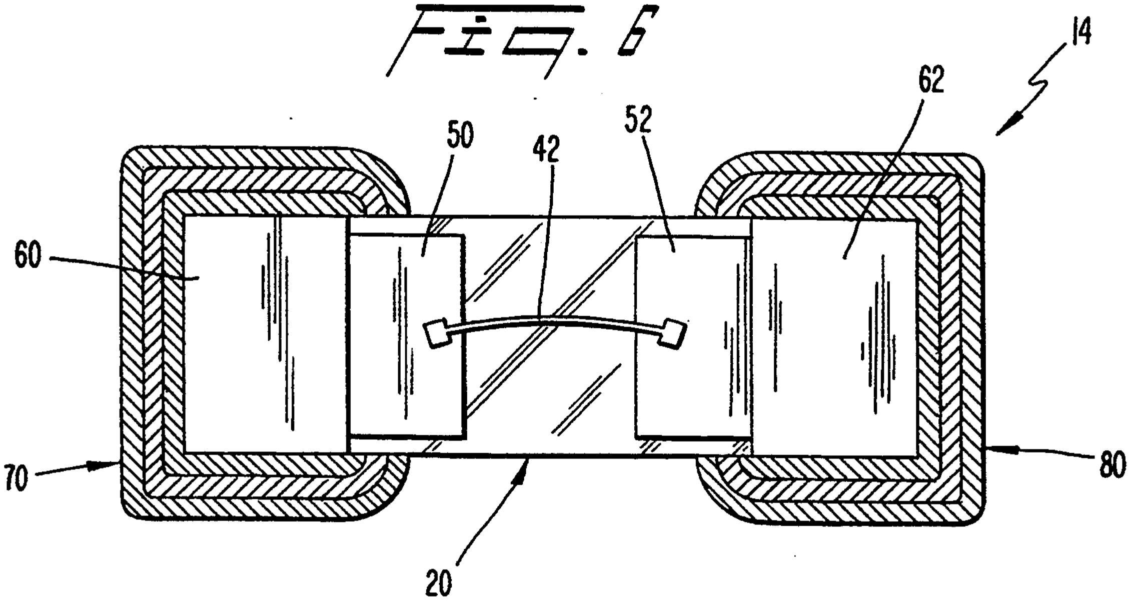
FIG. 6 is a top view of the circuit protector of FIG. 5.
Figure 7:
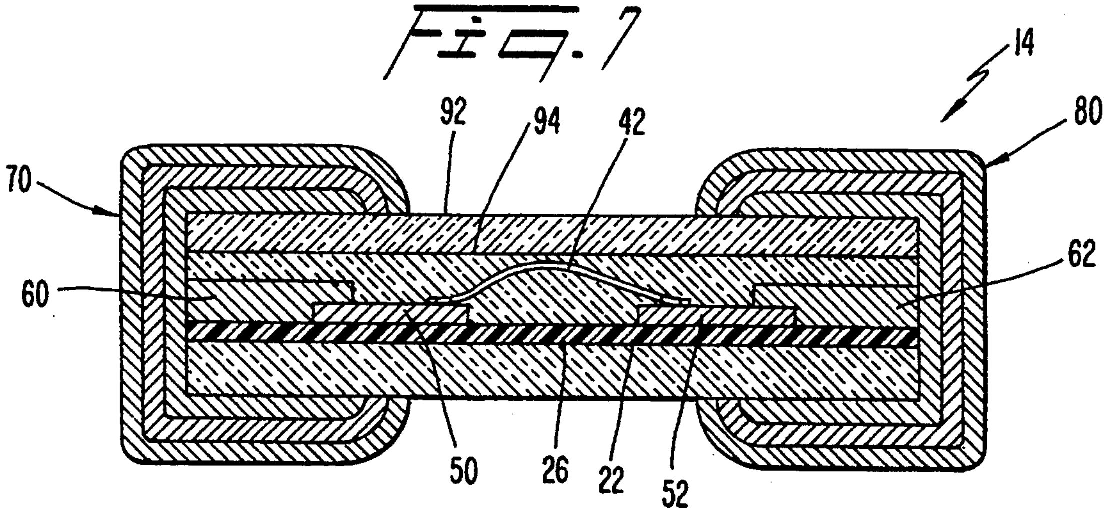
FIG. 7 is a side cross-sectional view of a circuit protector according to another alternative embodiment.

FIG. 5, FIG. 6 and FIG. 7 illustrate an embodiment of the invention in which the fuse element comprises a thin conductive wire 42. The wire element 42 is made of gold or another suitable material, and is attached to contact pads 50, 52. The wire element 42 is positioned after the contact pads 50, 52 are deposited and may be attached by ultrasonic heating or other suitable means. The dimensions of the wire element 42 may be selected for a desired fuse response of the circuit protector 14.

As illustrated in FIG. 5, the cover 90 may comprise a printed glass cover that suffuses the top surface 22, the wire 42 and the other components to enclose them without voids. Alternatively, as shown in FIG. 7, the cover 90 may comprise a plate 92, of glass or ceramic, bonded by a layer of bonding material 94, as described above.

The foregoing has described the preferred principles, embodiments and modes of operation of the present invention; however, the invention should not be construed as limited to the particular embodiments discussed. Instead, the above-described embodiments should be regarded as illustrative rather than restrictive, and it should be appreciated that variations, changes and equivalents may be made by others without departing from the scope of the present invention as defined by the following claims.

What is claimed is:

1. A circuit protector, comprising:

an electrically insulating substrate having a top surface, a bottom surface and opposing end portions having end edges and opposing lateral edges;

termination pads of electrically conductive material deposited on the top surface at opposing end portions of the substrate, each pad extending to one end edge and both opposing lateral edges;

a fuse element disposed across a space between the termination pads and electrically connecting the termination pads, the fuse element having a predetermined fuse characteristic;

a cover of electrically insulating material overlaying the top surface, the cover suffusing the substrate, fuse element and termination pads; and, electrically conductive terminations at the opposing end portions in electrical contact with the termination pads at the end edge and the lateral edges, the terminations extending over a portion of the bottom surface and the cover enclosing the termination pads.

2. The circuit protector as claimed in claim 1, wherein the fuse element further comprises contact pads of conductive material deposited on the opposing end portions and interposed between the fuse element and the termination pads to electrically connect the fuse element and the termination pads.

3. The circuit protector as claimed in claim 2, wherein the fuse element and the contact pads each have a predetermined thickness, the thickness of the contact pads being at least the thickness of the fuse element.

4. The circuit protector as claimed in claim 1, wherein the fuse element comprises an electrically conducting wire bonded at opposing ends to contact pads of electrically conductive material deposited on the top surface.

5. The circuit protector as claimed in claim 1, further comprising a layer of thermally insulating material deposited on the top surface, and interposed at least between the fuse element and the substrate.

6. The circuit protector as claimed in claim 1, wherein the cover comprises a plate of glass bonded to the top surface by a glass frit sealing material.

7. The circuit protector as claimed in claim 1, wherein the cover comprises a plate of ceramic bonded to the top surface by a ceramic adhesive.

8. The circuit protector as claimed in claim 1, wherein the cover comprises uncured ceramic material pressed on the top surface to conform with the top surface, and fired.

9. The circuit protector as claimed in claim 1, wherein the cover comprises a printed glass.

10. The circuit protector as claimed in claim 1, wherein the cover comprises a layer of high temperature polymer material applied to the top surface and cured.

11. The circuit protector as claimed in claim 1, wherein the end terminations comprise a layer of a silver containing material contacting the termination pads at the end edge and lateral edges.

12. The circuit protector as claimed in claim 11, wherein the end terminations further comprise a layer of nickel applied over the silver containing layer.

13. The circuit protector as claimed in claim 11, wherein the end terminations further comprise a layer of solderable material over the silver containing layer.

14. The circuit protector as claimed in claim 1, wherein the fuse element and the termination pads each have a predetermined thickness the thickness of the termination pads being at least the thickness of the fuse element.

15. A circuit protector, comprising:

an electrically insulating substrate having a top surface, a bottom surface and opposing end portions having end edges and opposing lateral edges;

a thermally insulating layer on the top surface;

a fuse element disposed across a space between the opposing end portions, the fuse element having a predetermined fuse characteristic;

contact pads of electrically conducting material disposed over end portions of the fuse element;

termination pads of electrically conductive material deposited over at least a portion of the contact pads, at the opposing end portions, each termination pad extending to one end edge and both opposing lateral edges, the termination pads, contact pads and fuse forming an electrical pathway;

a cover of electrically insulating material overlaying the thermally insulating layer, the cover suffusing the thermally insulating layer, the fuse element, the contact pads and the termination pads; and, electrically conductive terminations at the opposing end portions in electrical contact with the termination pads at the end edge and the lateral edges, the terminations extending over a portion of the bottom surface and the cover enclosing the termination pads.

* * * * *